United States Patent [19]

Carpe et al.

[11] Patent Number: 4,509,206
[45] Date of Patent: Apr. 2, 1985

[54] RECEIVER FOR MULTICARRIER SIGNALS PROTECTED FROM UNWANTED SIGNALS

[75] Inventors: Michel Carpe; Claude Collin; Marc Pontif, all of Paris, France

[73] Assignee: Thomson-CSF, Paris, France

[21] Appl. No.: 490,513

[22] Filed: May 2, 1983

[30] Foreign Application Priority Data

May 4, 1982 [FR] France ............... 82 07754

[51] Int. Cl.³ .................................. H04B 1/26
[52] U.S. Cl. ..................... 455/245; 455/247; 455/249; 455/251; 455/303; 455/311
[58] Field of Search ............ 455/234, 245, 246, 247, 455/250, 251, 253, 249, 17, 206, 296, 303, 311; 375/98, 102

[56] References Cited

U.S. PATENT DOCUMENTS

| | | | |
|---|---|---|---|
| 3,042,800 | 7/1962 | Gluth | 455/247 |
| 3,411,088 | 11/1968 | Hutchison | 455/17 |
| 3,667,043 | 5/1972 | Ahlgren | 455/17 |
| 3,831,095 | 8/1974 | Mounce | 455/253 |
| 4,126,828 | 11/1978 | Kumagai | 455/303 |

Primary Examiner—Marc E. Bookbinder
Attorney, Agent, or Firm—Cushman, Darby & Cushman

[57] ABSTRACT

The invention relates to a multicarrier signal receiver protected against unwanted signals. Between the high frequency circuit and the intermediate frequency circuit, it has a frequency-selective attenuation and preselection circuit, while a circuit for detecting the disturbed channels is coupled to the demodulation circuit and supplies control signals characteristic of the appearance and disappearance of the unwanted signals. The receiver also comprises a control circuit eliminating the disturbed channel for processing demodulated signals and for the automatic control of the intermediate frequency amplifier circuit, and controlling the attenuation of the disturbed channel in the selective attenuation circuit.

7 Claims, 3 Drawing Figures

RECEIVER FOR MULTICARRIER SIGNALS PROTECTED FROM UNWANTED SIGNALS

BACKGROUND OF THE INVENTION

The invention relates to multicarrier transmission equipment and more particularly to a receiver adapted to this type of transmission and which is protected from unwanted or interfering signals.

During the reception of signals formed from several modulated carriers, one of the problems to be solved relates to the protection against the effects of unwanted signals. In the reception of signals formed from several modulated carriers, it is not an economic proposition to use one reception channel for each carrier frequency. Thus, the receiver generally comprises high frequency and intermediate frequency circuits common to all the modulated carriers and a separate circuit permitting demodulation for each carrier.

The intermediate frequency amplifier common to all these carriers is an automatic gain control (AGC amplifier), whose gain is controlled by a voltage proportional to the envelope of the signal received having the highest level among the the signals transmitted on the different carriers. Thus, under normal conditions, this arrangement makes it possible to obtain a linear operation of the AGC amplifier.

At the output of this amplifier, the signal is branched to the different channels tuned to the frequencies to be demodulated. A control circuit receiving the voltages detected on the different channels permanently selects the highest detected voltage in order to apply it to the gain control input of the intermediate frequency amplifier.

In the presence of an unwanted signal, the protection of such a receiver is provided by successive high frequency and intermediate frequency filtering operations prior to amplification and by narrow band filtering centered on each of the intermediate frequencies. When the unwanted signal has a frequency within the pass band of the narrow band filters, the interference is at a maximum. Moreover, when the maximum detected voltage is that corresponding to the channel, whose carrier frequency is close to the frequency of the unwanted signal, it is this maximum detected voltage which is used as a reference for the gain control of the intermediate frequency amplifier. Thus, for an increasing level of the unwanted signal, the gain of the intermediate frequency amplifier decreases, so that the level of the signal before demodulation decreases until it reaches the limit value acceptable for a satisfactory operation of the demodulators. The level of the maximum admissible unwanted signal is determined as a function of the level of the useful signals, which must be maintained above the lower threshold of the dynamics of the demodulator.

Such a receiver is able to resist unwanted or interfering signals, whose frequency is close to one of the frequencies received, and whose maximum admissible level is approximately 20 decibels above the highest level useful signal, bearing in mind that the dynamics of the demodulator has a lower threshold of approximately −30 dB compared with the nominal level.

SUMMARY OF THE INVENTION

The present invention relates to a signal receiver protected against unwanted signals and in which the difference between the unwanted signal and the highest level useful signal can reach 80 decibels, the frequency of the unwanted signal being equal or close to one of the frequencies received.

The present invention therefore specifically relates to a multicarrier signal receiver comprising a high frequency amplification circuit having an output, a circuit for the preselection and selective attenuation of the intermediate frequency carriers comprising filters tuned to the intermediate frequency carriers, whose inputs are connected to the output of the high frequency circuit and whose outputs are connected to attenuators, each having a control input and an output, the output of the attenuators being connected to the inputs of an adder having an output, an intermediate frequency amplification circuit having an input connected to the output of the adder, and an output, a demodulation circuit comprising, for each modulated frequency, a filter connected to the output of the intermediate frequency amplification circuit, in series with a detector amplifier and a demodulator, whose output is an output of the demodulation circuit, and a circuit for detecting unwanted or interfering signals comprising, for each modulated carrier, an elementary detection circuit having an input connected to the output of the demodulator associated therewith and an output supplying a control signal characteristic of the appearance or the disappearance of an unwanted signal for the corresponding carrier, the output of the detection circuit associated with a carrier being coupled to the control input of the corresponding attenuator.

BRIEF DESCRIPTION OF THE DRAWINGS

The invention is described in greater detail hereinafter relative to non-limitative embodiments and the attached drawings, wherein show.

DETAILED DESCRIPTION OF THE INVENTION

Figure 1:
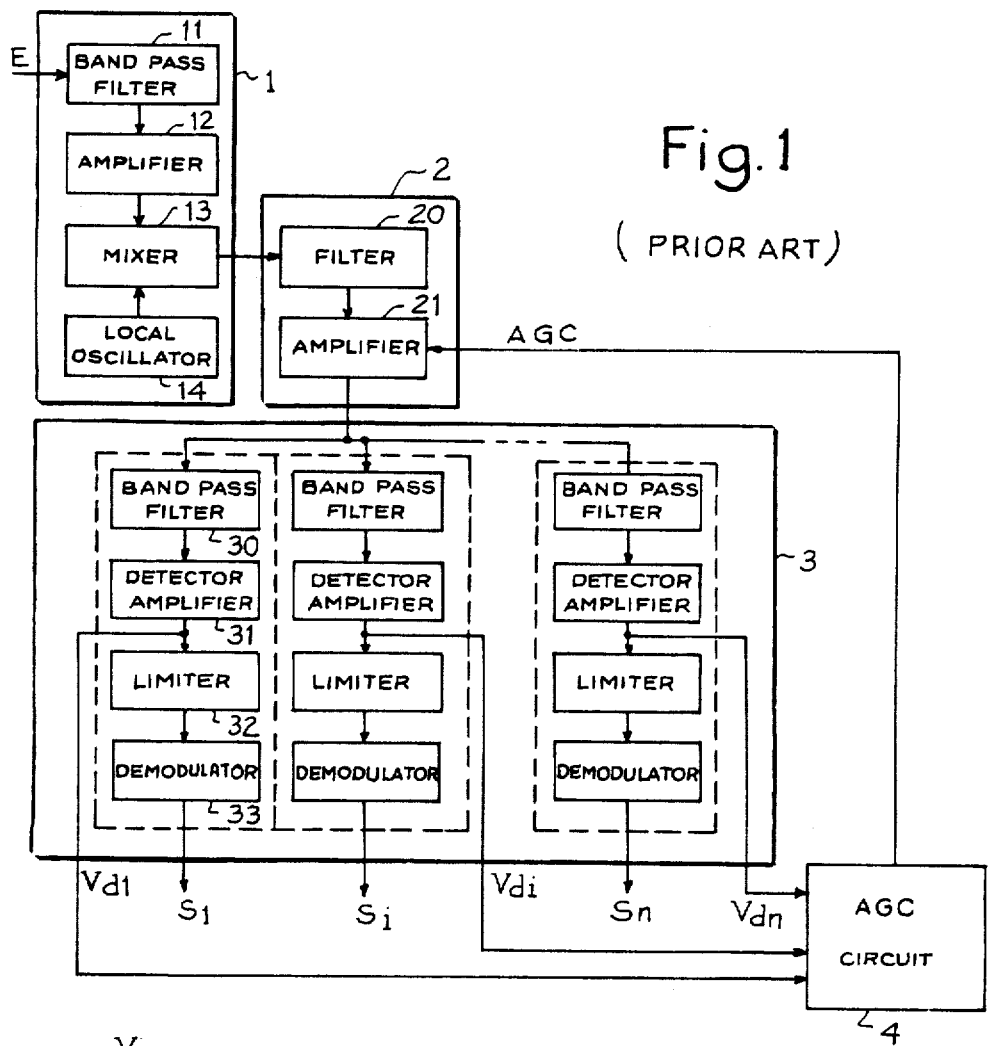
FIG. 1 the conventional diagram of a multicarrier receiver.
Figure 3:
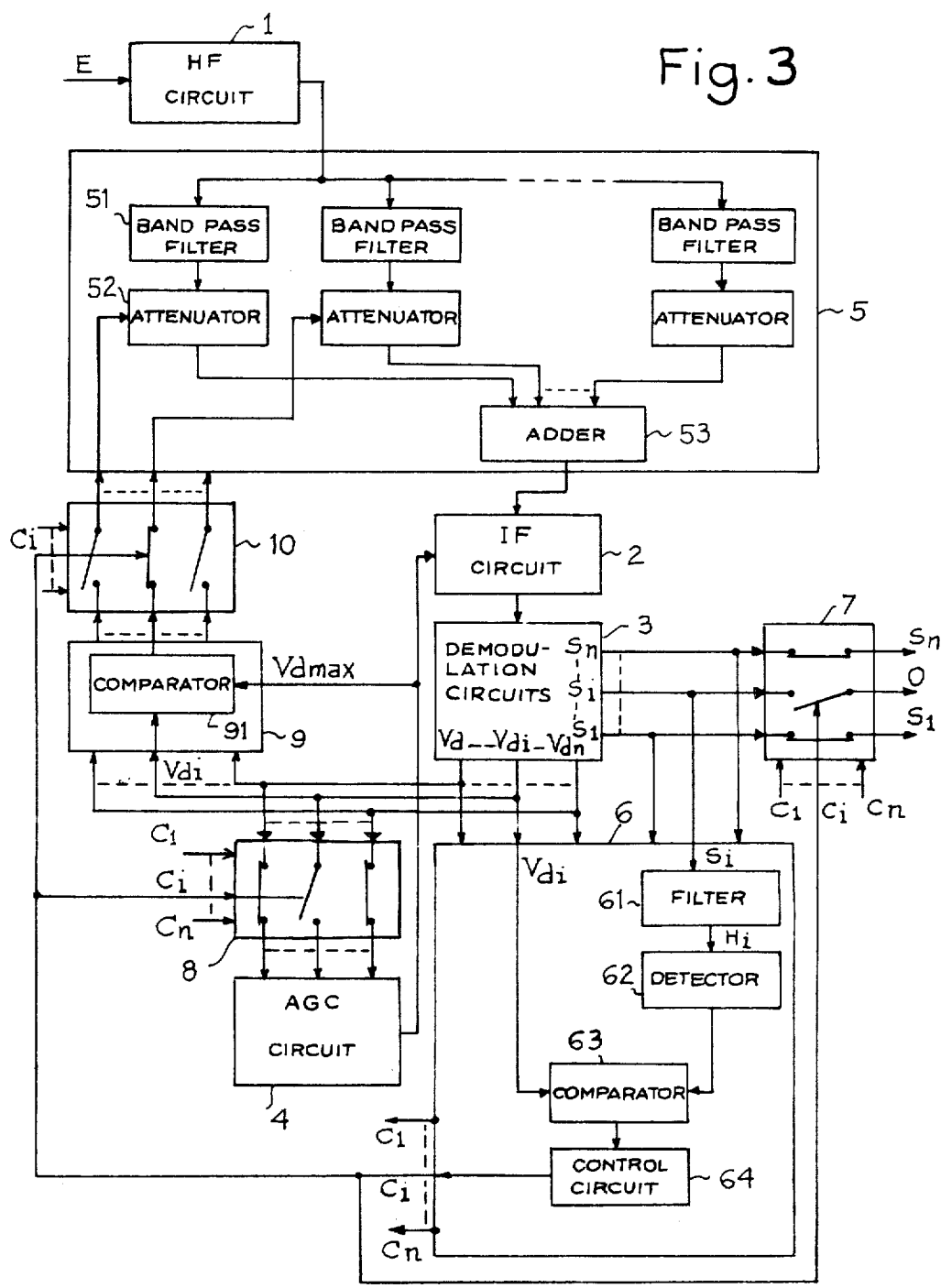
FIG. 3 the diagram of the multicarrier receiver protected against interfering signals in accordance with the present invention.

In FIGS. 1 and 3, identical elements are given the same references. The conventional multicarrier receiver shown in FIG. 1, comprises high frequency circuits 1, intermediate frequency circuits 2 and amplification, detection and demodulation circuits 3.

The high frequency circuits 1 comprise a band pass filter 11 coupled to the input E of the receiver, whose output is connected to the input of an amplifier 12, whose output is connected to the first input of a mixer 13. The second input of the mixer is connected to the output of a local oscillator 14. The output of the mixer supplies the intermediate frequency signal applied to the input of the intermediate frequency circuits 2 comprising a band pass filter 20, followed by an intermediate frequency amplifier 21. The latter is an automatic gain control amplifier having an AGC input. The output of amplifier 21 constitutes the output of the intermediate frequency circuit and is connected to the input of the demodulation circuits 3. The latter has, for each carrier, a band pass filter 30 tuned to the frequency of the corresponding channel $f_1, f_2 \ldots f_n$, the output of said band pass filter being connected to the input of a detector amplifier 31, whose output is connected to a limiting circuit 32. The input of a demodulator 33 is connected to the output of the limiting circuit and its output supplies the demodulated signal $S_i$, i=1 to n.

It has been stated hereinbefore that the AGC intermediate frequency amplifier was controlled by the maximum detected voltage of the different carriers. For this purpose, the outputs of the detector amplifiers 31, supplying detected voltages $V_{d1}$, $V_{d2}$ ... $V_{dn}$, are connected to the inputs of an AGC circuit 4. This circuit selects from among the voltages applied to its different inputs, that having the highest level and transmits it with an appropriate gain to the AGC input of the intermediate frequency amplifier 21.

Figure 2:
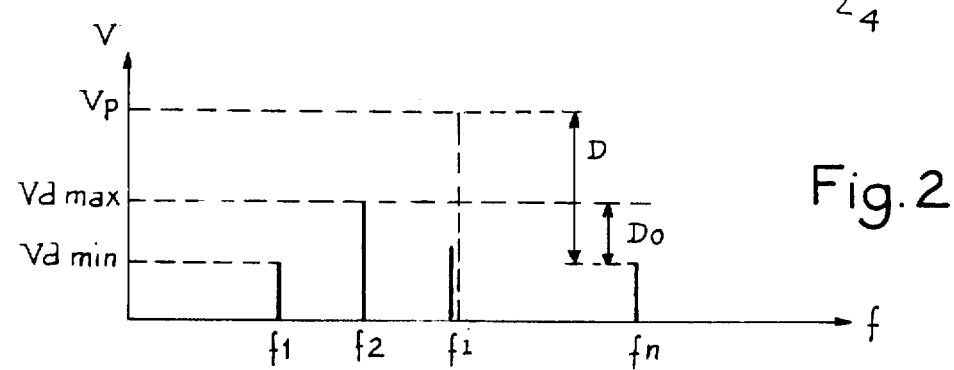
FIG. 2 a diagram of the frequency spectrum.

FIG. 2 shows the levels detected in the different channels having carrier frequencies $f_1$, $f_2$ ... $f_i$ ... $f_n$, with $V_{dmin}$ and $V_{dmax}$ being the minimum and maximum detected voltages on the different channels. $D_o$ is the variation between the two extreme detected voltages and is generally approximately 10 dB.

For example, in this case, an unwanted signal of level $V_p$ has been shown in dotted line form at a frequency close to frequency $f_i$ of channel i. D stands for the useful dynamics of the limiters permitting a satisfactory operation of the demodulators. In a conventional receiver, D is approximately 30 decibels and the difference $D-D_o$ equal to 20 decibels fixes the maximum admissible level of the unwanted signal at 20 decibels above the highest useful signal. If this level is exceeded, the signal at the input of the demodulators passes below their satisfactory operation threshold and all the channels are affected by this unwanted signal.

FIG. 3 shows the receiver according to the invention. Like the conventional receiver, it comprises high frequency circuits 1, whose input is coupled to the input E of the receiver and whose output is coupled to the input of the intermediate frequency circuits. However, between these high frequency circuits and the intermediate frequency circuits, the receiver according to the invention has a frequency selective attenuation and preselection circuit 5 formed in the following way. The output of the high frequency circuit 1 is connected to the inputs of n band pass filters, centered respectively on the carrier frequencies of the different channels. Each band pass filter 51 is followed by an electronically controlled attenuator 52, whose maximum attenuation can exceed 80 decibels, the residual attenuation being a few decibels. The outputs of these attenuators are connected to the inputs of an adder 53. The band pass filters of this preselection circuit, centered on frequencies $f_i$, have an adequate band width to transmit the modulated signal, and have an attenuation making it possible to eliminate the frequencies close to frequencies $f_i$. The output of adder 53 is connected to the input of the intermediate frequency circuits 2. The output of these circuits is connected, as in the conventional receiver, to the input of a detection and demodulation circuit 3, having n separate channels. As hereinbefore, this circuit 3 supplies demodulated output signals $S_1$ ... $S_n$ and the detected voltages $V_{d1}$ ... $V_{dn}$. The receiver according to the invention also has a disturbed channel detection circuit 6, which receives the detected voltages $V_{di}$ and the output signals $S_i$ from i=1 to n. The demodulated useful signals $S_i$ of channel i contains characteristic information $H_i$ permitting its identification as an effectively transmitted signal. This information can be a pilot frequency, when the circuit transmits analog signals, or the recovered clock frequency for the transmission of digital signals.

These known pure frequencies of the receiver are selected by filtering and detected. For this purpose, the disturbed channel detection circuit 6 has, for each channel, a filter 61, whose input is connected to the corresponding demodulated signal output, followed by a detector 62. The output of detector 62 and the detected signal output $V_{di}$ of the corresponding channel of the detection and demodulation circuit 3 are connected to the inputs of a comparator 63. This comparator 63 functions in the following way. In the absence of an unwanted signal, the detected clock level $H_i$ is high, while when an unwanted signal appears, this detected clock level rapidly decreases. Moreover, the detected voltage $V_{di}$ in the absence of the unwanted signal remains below the detected clock level, while when an unwanted signal appears, the detected voltage $V_{di}$ remains at a high level, whereas the detected clock level is low. Comparator 63 is a differential amplifier supplying at its output, a positive or negative signal, as a function of whether an unwanted signal has or has not appeared on channel i. The output of comparator circuit 63 is connected to the input of a control circuit 64 (logic circuit with threshold 0 volt), whose output supplies opening or closing control pulses to the switches in the following way.

Firstly, the outputs $S_i$ of the detection and demodulation circuit 3 are connected to the inputs of the processing circuit of the receiver (not shown) by electronically controlled switches 7. This processing circuit is, for example, a circuit for combining the signals of the different channels for a receiver operating in a multiplicity of frequencies. The output of the control circuit 64 of channel i is connected to the control input of the corresponding switch, the latter being closed when no unwanted signal has been detected by the comparator circuit, while switch 7 is open when an unwanted signal has been detected and then closed again when the unwanted signal has appeared. This information is given by the output of comparator 63 via control circuit 64.

Moreover, the detected signal outputs $V_{di}$ are connected to the inputs of the AGC circuit 4 via electronically controlled switches 8. The control input of the switch corresponding to channel i is connected to the outputs $C_i$ of the corresponding control circuit. When an unwanted signal has appeared on channel i, the corresponding switch is opened, in such a way that the detected voltage $V_{di}$ does not contribute to the processing of the gain control voltage of the AGC amplifier. Thus, the output of the AGC circuit 4 supplies to the AGC input the voltage $V_{dmax}$ equal to the highest detected voltage of all the channels, apart from that of channel i in which an unwanted signal has been detected.

When an unwanted signal arrives, circuit 6 thus detects channel i disturbed by the disappearance of the pilot frequency or clock, while the detected signal has a high level, and eliminates by means of switches 7 and 8, the contribution of channel i in the demodulated signal on the one hand and for the processing of the AGC voltage of the intermediate frequency circuit on the other.

Nevertheless, with such a circuit, the unwanted signal remains at high levels at the input of the intermediate frequency amplifiers. It is therefore necessary to attenuate it to prevent the formation of intermodulation products in this intermediate amplifier common to the n carriers. Thus, a high level unwanted signal at the input of the intermediate frequency amplifier saturates the amplifier, which then operates in a non-linear zone and generates intermodulation products. Bearing in mind the proximity of the frequencies of the different channels and the regular spacing which generally exists between these frequencies, the intermodulation products generated by the non-linearity of the intermediate frequency amplifier are products of type $2f_k - f_i$, k and i being the symbols of two adjacent carriers. These products can be located around a frequency $f_j$ close to the two first frequencies.

A first solution for solving this problem consists of interrupting channel i at the input of the intermediate frequency amplifier by controlling a very high attenuation of the corresponding attenuator 52 of channel 1. This solution makes it possible to obviate the aforementioned problem, but suffers from the disadvantage of not giving the information on the presence of the unwanted signal. To obtain this information, it is consequently necessary in a circuit of this type to periodically put channel i back into service, in order to ensure that the unwanted signals still exist or, conversely, that they have disappeared. In the latter case, the corresponding switches 7 and 8 must again be closed.

A second solution according to the preferred embodiment of the invention shown in FIG. 3, consists of introducing an attenuation, prior to intermediate frequency amplification, on channel i in which an unwanted signal has been detected. This attenuation is variable with the disturbance level on the one hand and the detected levels of other channels on the other. This solution makes it possible to bring the unwanted signal at the intermediate frequency amplifier input to a level such that no non-linearities occur, thus eliminating any risk of intermodulation, but maintaining said unwanted signal at a level within the dynamics of the demodulator, e.g. at the highest level of the n-1 other useful carrier frequencies.

To this end, the receiver according to the invention has a comparison circuit 9 with n comparators such as 91, receiving on the one hand the detected voltage $V_{di}$ of the corresponding channel, and on the other the maximum detected voltage $V_{dmax}$ of the voltages detected in the undisturbed channels. Voltage $V_{dmax}$ is the output voltage of the AGC circuit 4. Comparator 91 then supplies a signal proportional to the $V_{dmax} - V_{di}$, which may or may not be transmitted to the corresponding attenuator 52 of channel i, depending on whether the corresponding switch of interruption circuit 10 is open or closed. This control of switches 10 is brought about by control signal $C_i$. Thus, after attenuation in channel i, in which the unwanted signal has been detected, the level in the disturbed channel is equal to the maximum detected level in the other channels and the unwanted signal detection circuit permanently supplies the information on the presence of this unwanted signal, the detected signal in this channel having a relatively high level, while the clock level of the signal recovered in said same channel is very low. During the disappearance of this unwanted signal, the clock level again becomes high compared with the level of the signal detected in the same channel and the control signal changes state. The corresponding switches 7 and 8 are closed again, while switch 10 controlling the attenuation opens.

With PIN diode electronic attenuators, it is possible to realise an attenuation $A_i$ of approximately 80 decibels. Consequently, the above-described receiver is protected for unwanted signals, whose frequency is close or equal to one of the frequencies received and whose maximum level is approximately 80 decibels above the useful signal having the highest level. These figures are typically those corresponding to a tropospheric or ionospheric scattering, disturbed by directly received signals.

Thus, a multicarrier receiver of the aforementioned type continues to operate under satisfactory conditions with unwanted signals, the improvements being approximately 60 decibels compared with the aforementioned prior art system.

The invention is applicable to transmission equipment of the multicarrier type and more particularly to radio communications by satellite, tropospheric or ionospheric radio communications with a multiplicity of frequencies, or radio communications from moving vehicles with a multiplicity of frequencies.

What is claimed is:

1. A multicarrier signal receiver comprising a high frequency circuit for receiving a plurality of modulated carrier signals and having an output providing a corresponding plurality of modulated intermediate frequency carrier signals, a circuit for the preselection and selective attenuation of the intermediate frequency carrier signals comprising a plurality of filters tuned to the intermediate frequency carrier signals, whose inputs are connected to the output of the high frequency circuit and whose outputs are connected to respective attenuators, each having a control input and an output, an adder responsive to said attenuator outputs and having a sum output, an intermediate frequency amplification circuit having an input connected to the output of the adder, and an output, a demodulation circuit comprising a plurality of signal demodulation paths have one path for each modulated intermediate frequency carrier signal respective, each path including a filter connected to the output of the intermediate frequency amplification circuit, in series with a detector-amplifier and a demodulator, each path further including an elementary detection circuit for detecting an unwanted or interfering signal having an input connected to the output of a respective demodulator and an output supplying a control signal characteristic of an appearance or disappearance of an unwanted signal for the corresponding carrier signal, the output of the detection circuit associated with a particular carrier signal being coupled to the control input of the corresponding attenuator.

2. A receiver according to claim 1, wherein the intermediate frequency amplifier is controlled by an automatic gain control circuit having inputs coupled to the outputs of detector amplifiers and whose output provides the highest detected voltage present on said detector-amplifier outputs, wherein said receiver also comprises, between the outputs of the detector amplifiers and the inputs of the automatic gain control circuit, a first set of switches having electronic control inputs connected to the outputs of the plurality of elementary detection circuits for preventing the transmission of a detected voltage related to a disturbed channel to the AGC circuit.

3. A receiver according to claim 2 further comprising a second set of switches having respective inputs and outputs and having electronic control inputs connected to the respective outputs of the detection circuits, said inputs connected to respective outputs of the demodulators circuit and their outputs providing only desired signals.

4. A receiver according to claim 1, wherein an elementary detection circuit comprises a circuit for the recovery and detection of a clock signal having an input connected to the corresponding output of the demodulation circuit, a comparator having two inputs connected to the output of the corresponding detector-amplifier and to the output of the clock signal detection circuit, and a control circuit having an input connected to the output of the comparator and an output constituting the output of the elementary detection circuit which, on the basis of the relative levels of the clock signal and a detector-amplifier output signal, supplies the corresponding control signal.

5. A receiver according to claim 1, wherein the attenuators are enabled to attenuated in response to closing of switches controlled by said control signals.

6. A receiver according to claim 1, wherein the attenuators provide, during the appearance of an unwanted signal on the corresponding carrier, a variable attenuation bringing the amplitude of the unwanted signal to the input of the intermediate frequency amplification circuit to a level related to signal dynamics of the undisturbed channels, the attenuators being enabled to attenuate in response to closing of switches controlled by said control signals, said switches applying a variable amplitude voltage signal to the attenuators.

7. A receiver according to claim 6, wherein the receiver comprises, for each channel, a circuit for comparing the level of a detected carrier and the level of an undisturbed maximum level detected carrier, whose output provides said variable amplitude voltage signal.

* * * * *